(12) United States Patent
Kim et al.

(10) Patent No.: US 10,707,275 B2
(45) Date of Patent: Jul. 7, 2020

(54) DISPLAY APPARATUS AND METHOD OF MANUFACTURING THE SAME

(71) Applicant: Samsung Electronics Co., Ltd., Suwon-si, Gyeonggi-do (KR)

(72) Inventors: Jiwhan Kim, Seoul (KR); Seungyeon Kwak, Suwon-si (KR); Jongsoo Kim, Seoul (KR); Taegon Kim, Hwaseong-si (KR); Sunghun Lee, Hwaseong-si (KR); Deukseok Chung, Yongin-si (KR)

(73) Assignee: SAMSUNG ELECTRONICS CO., LTD., Gyeonggi-Do (KR)

(*) Notice: Subject to any disclaimer, the term of this patent is extended or adjusted under 35 U.S.C. 154(b) by 11 days.

(21) Appl. No.: 16/134,014

(22) Filed: Sep. 18, 2018

(65) Prior Publication Data
US 2019/0148460 A1 May 16, 2019

(30) Foreign Application Priority Data
Nov. 15, 2017 (KR) .................. 10-2017-0152511

(51) Int. Cl.
*H01L 27/32* (2006.01)
*H01L 51/52* (2006.01)
(Continued)

(52) U.S. Cl.
CPC ...... *H01L 27/322* (2013.01); *G02F 1/133605* (2013.01); *G02F 1/133606* (2013.01);
(Continued)

(58) Field of Classification Search
CPC ............. H01L 51/5268; H01L 51/5275; H01L 51/5278; H01L 51/5036; H01L 27/322;
(Continued)

(56) References Cited

U.S. PATENT DOCUMENTS

| 6,063,527 A | * | 5/2000 | Nishikawa | G02B 5/223 430/7 |
| 6,608,439 B1 | * | 8/2003 | Sokolik | B82Y 20/00 313/504 |

(Continued)

FOREIGN PATENT DOCUMENTS

| CN | 105242449 A | 1/2016 |
| CN | 107092125 A | 8/2017 |
| KR | 1020170071660 A | 6/2017 |

*Primary Examiner* — Zandra V Smith
*Assistant Examiner* — Jeremy J Joy
(74) *Attorney, Agent, or Firm* — Cantor Colburn LLP

(57) ABSTRACT

A display apparatus includes a light-source substrate portion which generates light; and a color control portion to which the generated light from the light-source substrate portion is incident and at which color of the generated light is adjusted to define a color-converted light having a color different from that of the generated light. The color control portion includes: an exit surface through which the color-converted light exits the color control portion; a substrate including a plurality of concave portions defined therein, each of the concave portions extended along a direction from the light-source substrate portion to the exit surface of the color control portion; and a plurality of color conversion members respectively in the plurality of concave portions, the color conversion members each including a color-converting material which converts the color of the generated light to the color of the color-converted light.

22 Claims, 8 Drawing Sheets

(51) Int. Cl.
*G02F 2/02* (2006.01)
*G02F 1/13357* (2006.01)
*G02F 1/1335* (2006.01)
*G02F 1/017* (2006.01)

(52) U.S. Cl.
CPC ............ G02F 2/02 (2013.01); H01L 51/5268 (2013.01); H01L 51/5275 (2013.01); *G02F 1/133504* (2013.01); *G02F 1/133526* (2013.01); *G02F 1/133617* (2013.01); *G02F 2001/01791* (2013.01); *G02F 2001/133607* (2013.01); *G02F 2001/133614* (2013.01); *G02F 2202/108* (2013.01); *G02F 2202/30* (2013.01); *G02F 2202/36* (2013.01); *H01L 2251/5307* (2013.01); *H01L 2251/5315* (2013.01); *H01L 2251/5369* (2013.01)

(58) Field of Classification Search
CPC ....... H01L 33/504; H01L 33/58; H01L 33/50; H01L 25/0753; H01L 2251/5315; H01L 2251/5369; G02F 1/133514; G02B 5/201; G02B 5/206; G02B 5/207
See application file for complete search history.

(56) References Cited

U.S. PATENT DOCUMENTS

| | | | |
|---|---|---|---|
| 7,088,043 B2 * | 8/2006 | Min | H01J 11/12 313/582 |
| 7,934,862 B2 | 5/2011 | Anandan | |
| 8,459,855 B2 | 6/2013 | Anandan et al. | |
| 8,496,367 B2 | 7/2013 | Anandan | |
| 9,664,826 B2 * | 5/2017 | Lee | G02B 5/201 |
| 2003/0076609 A1 * | 4/2003 | Kawase | G02B 5/201 359/885 |
| 2003/0113639 A1 * | 6/2003 | Kawase | G02B 5/201 430/7 |
| 2006/0139580 A1 * | 6/2006 | Conner | G02B 27/0994 353/98 |
| 2008/0063954 A1 * | 3/2008 | Song | G02B 5/201 430/7 |
| 2008/0297705 A1 * | 12/2008 | Kuo | G02F 1/133555 349/106 |
| 2010/0141877 A1 * | 6/2010 | Huang | B29D 11/00634 349/106 |
| 2011/0176328 A1 * | 7/2011 | Anandan | G02B 6/0036 362/606 |
| 2014/0160408 A1 * | 6/2014 | Cho | G02F 1/133617 349/110 |
| 2015/0084026 A1 * | 3/2015 | Miyamoto | H01L 51/5275 257/40 |
| 2015/0090991 A1 * | 4/2015 | Ishii | H01L 27/322 257/40 |
| 2015/0131029 A1 * | 5/2015 | Kaida | G02F 1/133617 349/69 |
| 2016/0351749 A1 * | 12/2016 | Coe-Sullivan | H05B 33/145 |
| 2017/0075052 A1 * | 3/2017 | Saitoh | H01L 33/50 |
| 2017/0082892 A1 * | 3/2017 | Chung | G02B 5/085 |
| 2017/0090247 A1 * | 3/2017 | Lee | G02F 1/133617 |
| 2017/0125740 A1 * | 5/2017 | Lee | H01L 27/322 |
| 2017/0168203 A1 | 6/2017 | Do et al. | |
| 2017/0235223 A1 | 8/2017 | Liang | |
| 2017/0250316 A1 * | 8/2017 | Yeon | H01L 33/50 |
| 2017/0271606 A1 * | 9/2017 | Choi | H01L 51/502 |
| 2018/0166424 A1 * | 6/2018 | Sim | H01L 33/62 |
| 2018/0356688 A1 * | 12/2018 | Chen | G02F 1/133617 |

\* cited by examiner

< COMPARATIVE EXAMPLE >

< EMBODIMENT >

DISPLAY APPARATUS AND METHOD OF MANUFACTURING THE SAME

CROSS-REFERENCE TO RELATED APPLICATION

This application claims priority to Korean Patent Application No. 10-2017-0152511, filed on Nov. 15, 2017, and all the benefits accruing therefrom under 35 U.S.C. § 119, the disclosure of which is incorporated herein in its entirety by reference.

BACKGROUND

1. Field

The present disclosure relates to display apparatuses and methods of manufacturing the display apparatuses.

2. Description of the Related Art

Quantum dots are semiconductor crystals having a nanometer size and the energy bandgap of a quantum dot may be adjusted according to the size and shape of the quantum dot. When the size of a semiconductor material is reduced to a nanometer size like quantum dots, unique optical characteristics may be obtained due to a quantum mechanics phenomenon. In particular, quantum dots are being researched as a next generation display material because the quantum dots have relatively high emission efficiency and a relatively narrow full width at half maximum ("FWHM") in a visible range.

SUMMARY

Provided are configurations and technologies to improve color conversion and light extraction efficiencies by quantum dots ("QDs") in implementing a color conversion member using QDs.

Provided are display apparatuses including a color conversion member using QDs, and having excellent light efficiency and color characteristics.

Provided are methods of manufacturing the display apparatuses.

Additional features will be set forth in part in the description which follows and, in part, will be apparent from the description, or may be learned by practice of the presented embodiments.

According to an embodiment, a display apparatus includes a light-source substrate portion which generates light; and a color control portion to which the generated light from the light-source substrate portion is incident and at which color of the generated light is adjusted to define a color-converted light having a color different from that of the generated light. The color control portion includes: an exit surface through which the color-converted light exits the color control portion; a substrate including a plurality of concave portions defined therein, each of the concave portions extended along a direction from the light-source substrate portion to the exit surface of the color control portion; and a plurality of color conversion members respectively in the plurality of concave portions, the color conversion members each including a color-converting material which converts the color of the generated light to the color of the color-converted light.

Each of the plurality of concave portions may include a first portion and a second portion sequentially arranged in the direction from the light-source substrate portion to the exit surface of the color control portion, the first portion being arranged closer to the light-source substrate portion than the second portion. A width of the first portion and the second portion may be taken in a direction along the light-source substrate portion. As a distance to the light-source substrate portion decreases along the direction from the light-source substrate portion to the exit surface of the color control portion, the width of the first portion decreases to define a width change rate of the first portion, and the width change rate of the first portion may be greater than a width change rate of the second portion.

Along the direction from the light-source substrate portion to the exit surface of the color control portion, the width of the second portion may be substantially constant.

In cross-section, the first portion may have a round shape.

Each of the plurality of concave portions may have a shape of any one of a microlens, a pyramid, a tapered hexagonal column and a cone.

The light-source substrate portion may include a plurality of subpixel areas, and each of the plurality of concave portions may be disposed in one-to-one correspondence with the plurality of subpixel areas.

The light-source substrate portion may include a plurality of subpixel areas, the plurality of concave portions may include a plurality of first concave portions each corresponding to a same first subpixel area, and within the same first subpixel area, two adjacent first concave portions may contact each other.

The plurality of concave portions may further include a plurality of second concave portions each corresponding to a same second subpixel area, the same second subpixel area being sequentially arranged with the first subpixel area within the light-source substrate portion, the plurality of first concave portions may together form a group thereof within the same first subpixel area and the plurality of second concave portions may together form a group thereof within the same second subpixel area, and within the substrate of the color control portion, the group of the plurality of first concave portions and the group of the plurality of second concave portions may be spaced apart from each other.

The color control portion may further include an incident surface through which the generated light is incident to the color control portion, an upper surface of the substrate may include the exit surface and a lower surface of the substrate may include the incident surface, upper ends of concave portions may coincide with the upper surface of the substrate, and lower ends of the plurality of concave portions which are closest to the light-source substrate portion may meet the light-source substrate portion at a zero dimension point or at a two-dimensional area.

The color control portion may further include an incident surface through which the generated light is incident to the color control portion, an upper surface of the substrate may include the exit surface and a lower surface of the substrate may include the incident surface, upper ends of the plurality of concave portions may coincide with the upper surface of the substrate, and along the direction from the light-source substrate portion to the exit surface of the color control portion, lower ends of the plurality of concave portions which are closest to the light-source substrate portion may be spaced apart from the light-source substrate portion.

The substrate of the color control portion may have a first refractive index, and the plurality of color conversion members may have a second refractive index, the second refractive index being greater than the first refractive index.

The plurality of color conversion members may include a first color-converting material including a first quantum dot which converts the color of the generated light from the light-source substrate portion to red light, and a second color-converting material a second quantum dot which converts the color of the generated light from the light-source substrate portion to green light.

The color control portion may further include a light scattering member or a light transmission member in a concave portion different from the plurality of concave portions in which the plurality of color conversion members are disposed. Each of the light scattering member and the light transmission member may not color-convert the generated light from the light-source substrate portion.

The light-source substrate portion may include an organic light emitting device ("OLED") substrate, and the OLED substrate may include any one of a blue-OLED substrate, a white-OLED substrate and a cyan-OLED substrate.

The light-source substrate portion may include an organic light emitting device ("OLED"), an inorganic light-emitting device ("LED") or a backlight unit ("BLU") which generates the light.

The generated from the light-source substrate portion may have a center wavelength of about 550 nanometers (nm) or less, and the color-converted light from the plurality of color conversion members may have a center wavelength of about 450 nm or more and about 1200 nm or less.

The light-source substrate portion may include a first substrate on which is disposed a light-source device portion with which the light-source substrate portion is driven to generate the light, the substrate of the color control portion may be a second substrate different from the first substrate of the light-source substrate, and the light-source device portion may be provided between the first substrate and the second substrate.

The light-source substrate portion may include a first substrate and a light-source device portion provided on the first substrate, and the first substrate may correspond to the substrate of the color control portion.

According to another embodiment, a display apparatus includes: an organic light emitting device ("OLED") panel which generates light; and a color control portion to which the generated light from the OLED panel is incident and at which color of the generated light is adjusted to define a color-converted light having a color different from that of the generated light. The color control portion includes: an exit surface through which the color-converted light exits the color control portion; a substrate including a plurality of concave portions defined therein, each of the concave portions extended along a direction from the OLED panel to the exit surface of the color control portion; and a plurality of color conversion members respectively in the plurality of concave portions, the color conversion members each including a color-converting material which converts the color of the generated light to the color of the color-converted light. The OLED panel includes a plurality of subpixel areas at which the color-converted light is emitted to display an image, and the plurality of concave portions of the color control portion are disposed in one-to-one correspondence with the plurality of subpixel areas of the OLED panel.

Each of the plurality of concave portions may include a first portion and a second portion sequentially arranged in the direction from the OLED panel to the exit surface of the color control portion, the first portion being arranged closer to the OLED panel than the second portion. A width of the first portion and the second portion may be taken in a direction along the organic light emitting device panel, and as a distance to the OLED panel decreases along the direction from the OLED panel to the exit surface of the color control portion, the width of the first portion may decrease to define a width change rate of the first portion, and the width change rate of the first portion may be greater than a width change rate of the second portion.

BRIEF DESCRIPTION OF THE DRAWINGS

These and/or other features will become apparent and more readily appreciated from the following description of the embodiments, taken in conjunction with the accompanying drawings in which.

DETAILED DESCRIPTION

Figure 1:
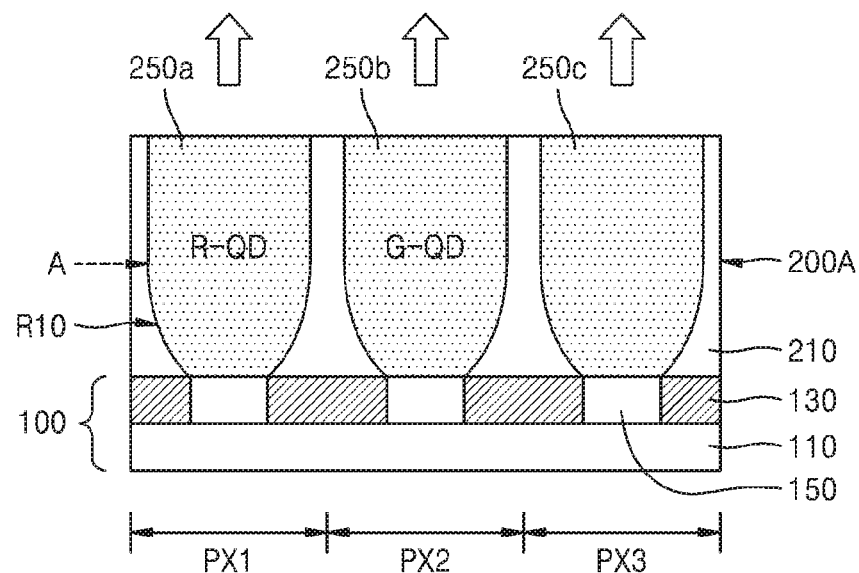
FIG. 1 is a cross-sectional view of a display apparatus according to an embodiment.

Various example embodiments will now be described more fully with reference to the accompanying drawings in which example embodiments are shown. This invention may, however, be embodied in many different forms, and should not be construed as limited to the example embodiments set forth herein. Rather, these example embodiments are provided so that this disclosure will be thorough and complete, and will fully convey the scope of the invention to those skilled in the art. Like reference numerals refer to like elements throughout.

It will be understood that when an element is referred to as being related to another element such as being "connected" or "coupled" to another element, it can be directly connected or coupled to the other element or intervening elements may be present. In contrast, when an element is referred to as being related to another element such as being "directly connected" or "directly coupled" to another element, there are no intervening elements present.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. "At least one" is not to be construed as limiting "a" or "an." As used herein the term "and/or" includes any and all combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Hereinafter, display apparatuses and methods of manufacturing the same according to embodiments are described in detail with reference to the accompanying drawings. In the drawings, widths and thicknesses of layers or regions may be exaggerated to a degree for clarity of the specification and for convenience of description. Throughout the detailed description section of the present inventive concept, like reference numerals denote like constituent elements.

When quantum dots are applied to generate and emit light within a display apparatus, light emission by the quantum dots is generally made in an isotropic direction, without any particular directivity. Thus, where light emission by the quantum dots is generally made without any particular directivity, light conversion and light extraction efficiencies are relatively very low. Thus, technologies to improve the light conversion and light extraction efficiencies by quantum dots are desired.

FIG. 1 is a cross-sectional view of a display apparatus according to an embodiment.

Referring to FIG. 1, a light-source substrate portion 100 may be provided, and a color control portion 200A for adjusting color of light generated from the light-source substrate portion 100 may be provided on a surface of the light-source substrate portion 100. The color control portion 200A may define a light exit surface of the display apparatus without being limited thereto.

The light-source substrate portion 100 may be a light source organic light-emitting device ("OLED") or an OLED substrate (OLED panel). In this case, the OLED substrate may collectively be, for example, one of a blue-OLED substrate generating blue light, a white-OLED substrate generating white (W) light and a cyan-OLED substrate generating cyan light. However, the colors of light emitted from the OLED substrate are not limited thereto and may be variously changed.

In a detailed example, the light-source substrate portion 100 may include a substrate (base) layer 110 and an emission unit 150 (e.g., light emission member) which is provided on the substrate layer 110. The emission unit 150 may be sectioned into a plurality of areas by a pixel defining layer 130. The plurality of areas may each respectively be light-emitting areas. Accordingly, it may be regarded that a plurality of emission units as light-emitting areas are provided as the collective emission unit 150. Light for displaying an image may be generated at the plurality of emission units. The emission unit 150 may include an organic-based emission layer (that is, an organic emission layer) with which light for displaying the image is generated within the display apparatus.

The light-source substrate portion 100 may be sectioned into a plurality of subpixel areas PX1, PX2 and PX3. The subpixel areas PX1, PX2, and PX3 may include, for example, a first subpixel area PX1, a second subpixel area PX2 and a third subpixel area PX3. However, the configuration of the light-source substrate portion 100 is not limited thereto and may be variously changed. Light for displaying the image may be generated and/or emitted at each of the plurality of subpixel areas, without being limited thereto.

The display apparatus and/or components thereof, may be disposed in a plane defined by a first direction and/or a second direction which cross each other. The horizontal direction of the view in FIG. 1 may represent the first direction and/or the second direction. In an embodiment, the subpixel areas of the display apparatus may be arranged in the first direction and/or the second direction along the substrate layer 110. A thickness of the display apparatus and/or components thereof, may be defined along a third direction which crosses the first and second directions. The vertical direction of the view in FIG. 1 represents the third (thickness) direction.

Furthermore, the light-source substrate portion 100 is not limited to an OLED substrate, and may include an inorganic-based light-emitting diode ("LED") or a backlight unit ("BLU"). That is, the light-source substrate portion 100 may be used in a display panel which is self-emissive or with a display panel which receives light generated outside thereof, to display an image. In an embodiment, when the BLU is used, a display panel within a liquid crystal device which receives light generated and emitted by the backlight unit may be used together with the BLU.

The color control portion 200A may include a substrate material layer 210, and a concave portion R10 may be defined or formed in plurality in the substrate material layer 210 such as by portions thereof. The concave portions R10 may be disposed or formed to extend toward the light-source substrate portion 100 from a light exit surface of the display apparatus. In other words, the concave portions R10 may be disposed or formed to have a length in a direction perpendicular to the light-source substrate portion 100 (e.g., vertical direction in FIG. 1, along a thickness direction). The concave portion R10 may be penetrate through the substrate material layer 210 to be open at both the light exit surface of the display apparatus and a light incident surface of the color control portion 200A.

The color control portion 200A may include a color conversion member 250a and 250b respectively provided in the concave portions R10 and including quantum dots ("QDs"). The color conversion members 250a and 250b may each be provided in plurality within the color control portion 200A, without being limited thereto. The color conversion members 250a and 250b may be exposed to outside the display apparatus at the exit surface thereof, without being limited thereto.

The first and second color conversion members 250a and 250b may include, for example, the first color conversion member 250a having a first QD and the second color conversion member 250b having a second QD, respectively. The first QD may be, for example, a material which converts a wavelength of light incident thereto to red light for implementation of a red color used in displaying the image, and the second QD may be, for example, a material which converts a wavelength of light incident thereto to green light for implementation of a green color used in displaying the image.

Furthermore, the color control portion 200A may further include a light scattering member 250c provided in any one of the concave portions R10. The light scattering member 250c may not be provided in a concave portion R10 in which the first and second color conversion members 250a and 250b are disposed, without being limited thereto. The light scattering member 250c may not include a wavelength-converting material such as the QDs discussed above. That is, the color control portion 200A may include a concave portion R10 at which light incident thereto is not color-converted such that the same color light is incident to and emitted from this particular concave portion R10. In an embodiment, the light scattering member 250c may be replaced with a light transmission member having no light-scattering function, and the light transmission member may not include QDs. That is, the light transmission member may merely transmit light incident thereto. The light scattering member 250c and/or the light transmission member may be exposed to outside the display apparatus at the exit surface thereof (e.g., at the open end of the concave portion R10), without being limited thereto. For convenience of description, label 250 may be used to generally refer to a color conversion member or the light scattering (or transmission) member discussed above.

The concave portions R10 may be configured to improve color conversion and light extraction through the first and second color conversion members 250a and 250b disposed or formed therein. Each of the concave portions R10 may include a "first portion" and a "second portion" which are sequentially arranged along a thickness (e.g., height direction, vertical direction in FIG. 1) of the color control portion 200A. The first portion may be arranged relatively closer to the light-source substrate portion 100 than the second portion. In FIG. 1, roughly with respect to a point A, a lower portion of each of the concave portions R10 may correspond to the first portion, and an upper portion of each of the concave portions R10 may correspond to the second portion. The first portion may include an entirety of the concave portion R10 from point A to a point closest to the light-source substrate portion 100, while the second portion may include an entirety of the concave portion R1 from the point A to a point furthest from the light-source substrate portion 100.

A width of the concave portion R10, taken in the first and/or second directions (e.g., along the substrate layer 110, for example), changes along the thickness direction of the color control portion 200A. A width change rate of the first portion may be greater than a width change rate of the second portion. The width of the first portion may decrease along a length of the concave portion R10, in a direction towards the light-source substrate portion 100. The width change of the second portion may be relatively small or may be substantially unchanged, compared to the width change of the first portion. In the latter case, the width of the second portion may be almost constant.

Furthermore, referring to the cross-sectional view of FIG. 1, at least a part of the first portion of the concave portion R10 may have a round or curved shape. In connection with the shape/structure of each of the concave portions R10, color conversion and light extraction efficiencies may be improved through the first and second color conversion members 250a and 250b disposed or formed in the concave portions R10, which will be described below in detail with reference to FIGS. 4A and 4B and FIG. 6.

The first color conversion member 250a may be a member including Red-QD, and may convert an incident color light emitted from the light-source substrate portion 100 and incident to the color control portion 200A at the first color conversion member 250a, to red (R) light. The second color conversion member 250b may be a member including Green-QD, and may convert the incident color light emitted from the light-source substrate portion 100 and incident to the color control portion 200A at the second color conversion member 250b, to green (G) light.

In an embodiment of manufacturing a display apparatus, the first and second color conversion members 250a and 250b may be formed by combining a resin (base) material and QDs. The first and second color conversion members 250a and 250b may be formed by further combining a light scattering agent to the resin material and/or the QDs. The first and second color conversion members 250a and 250b may be an organic/inorganic combination including QDs and a polymer medium.

The light scattering member 250c may include a resin (base) material and a light scattering agent. The resin material may include, for example, a photoresist ("PR") material. The light scattering agent may include, for example, titanium oxide ($TiO_2$), etc., but the present disclosure is not limited thereto.

The first color conversion member 250a may correspond to a first subpixel area (red pixel area) PX1 at which a red light is emitted from the display apparatus for displaying the image. The second color conversion member 250b may correspond to a second subpixel area (green pixel area) PX2 at which a green light is emitted from the display apparatus for displaying the image. The light scattering member 250c may correspond to a third subpixel area (blue pixel area) PX3 at which a blue (B) light is emitted from the display apparatus for displaying the image. Thus, the color control portion 200A may implement a full color of RGB. An arrangement sequence or method of RGB subpixels PX1, PX2 and PX3 disclosed herein are exemplary and may be variously changed.

The first QD that is included in the first color conversion member 250a may be a Red-QD, and the second QD that is included in the second color conversion member 250b may be a Green-QD. A QD denotes a semiconductor particle having a nanometer-sized relatively small sphere or a shape similar thereto, and may have a size (diameter) of about several nanometers to about several tens of nanometers. A QD may have a monolithic structure or a core-shell structure. The core-shell structure may have a single shell or a multi-shell. For instance, the core-shell structure may include a core part (central body) including or formed of a first semiconductor and a shell part including or formed of a second semiconductor.

A core part (central body) material may include cadmium selenide (CdSe), cadmium telluride (CdTe), cadmium sulfide (CdS), etc. A shell part material may include zinc sulfide (ZnS), etc. Furthermore, a non-cadmium-based QD may be used. In other words, various materials not including cadmium (Cd) may be used for a QD. However, the above proposed materials are exemplary and other various materials may be used for a QD. In an embodiment, for example, the QD may include at least one of II-VI group based semiconductor, III-V group based semiconductor, IV-VI group based semiconductor and IV group based semiconductor.

Since the QD has a relatively very small size, a quantum confinement effect may be obtained. When particles are relatively very small, electrons in the particle have a discontinuous energy state by an outer wall of a particle. In this case, as the size of a space in the particle decreases, the energy state of the electrons relatively increases and an energy band gap increases, which is referred to as the quantum confinement effect. According to the quantum confinement effect, when light such as an infrared ray or a visible ray is incident on QDs, light having a wavelength of various ranges may be generated. The wavelength of various ranges may be different from a wavelength range of the light incident to the QDs.

The wavelength of light generated from a QD may be determined based on the size, material, or structure of a particle ("QD"). In detail, when light of a wavelength having energy greater than the energy band gap is incident on a QD, the QD may absorb energy of the light and be excited, and may return to the ground state by emitting light of a specific wavelength. In this case, as the size of a QD (or the core part of the QD) decreases, light of a relatively short wavelength, for example, a blue-based light or a green-based light may be generated. As the size of a QD (or the core part of the QD) increases, light of a relatively long wavelength, for example, a red-based light may be generated. Accordingly, light of various colors may be implemented depending on the size of a QD (or the core part of the QD). A QD particle capable of emitting a green-based light may be referred to as a green light QD particle (green QD particle), and a QD particle capable of emitting a red-based light may be referred to as a red light QD particle (red QD particle). In an embodiment, for example, a green light QD particle (or the core part) may be a particle having a width (diameter) of about 2 nanometers (nm) to about 3 nm, and a red light QD particle (or the core part) may be a particle having a width (diameter) of about 5 nm to about 6 nm. The emission wavelength may be adjusted not only by the size (diameter) of a QD, but also by the constituent material and structure thereof.

The substrate material layer 210 of the color control portion 200A may have a first refractive index, and the first and second color conversion members 250a and 250b may have a second refractive index that is greater than first refractive index. In other words, the substrate material layer 210 may include or be formed of a material having a relatively low refractive index, and the first and second color conversion members 250a and 250b may include or be formed of a material having a relatively high refractive index. In this case, reflection (total reflection) of light may be properly performed at a boundary surface or interface between the substrate material layer 210, and the first and second color conversion members 250a and 250b, respectively. Accordingly, in the process of emitting light through the first and second color conversion members 250a and 250b, color conversion efficiency and color extraction efficiency may be improved by the light reflection at the boundary surface.

The first and second color conversion members 250a and 250b may serve as an optical waveguide. The substrate material layer 210 may include or be formed of glass or polymer. Even when there is no partition wall such as a light-blocking black matrix between the first and second color conversion members 250a and 250b, independent color extraction for each color may be performed without a color mixing problem.

First light emitted from the light-source substrate portion 100 and incident to the color conversion portion 200A, may have a center wavelength of about 550 nm or less. In an embodiment, for example, the first light may have a center wavelength of about 350 nm or more and about 550 nm or less. Second light emitted from the first and second color conversion members 250a and 250b to exit from the display apparatus may have energy lower than the first light. In other words, the second light may have a wavelength greater than that of the first light. In an embodiment, for example, the second light may have a center wavelength of about 450 nm or more and about 1200 nm or less. The second light may be light of a visible range or an infrared range.

Figure 2:
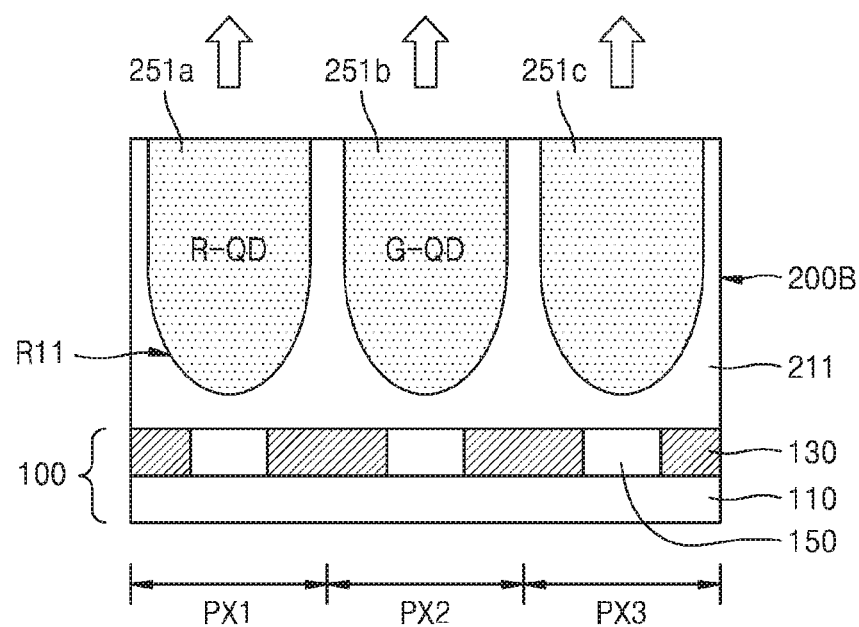
FIG. 2 is a cross-sectional view of a display apparatus according to a modified embodiment of FIG. 1.

FIG. 2 is a cross-sectional view of a display apparatus according to a modified embodiment of FIG. 1.

Referring to FIG. 2, a color control portion 200B may be provided on the light-source substrate portion 100. The color control portion 200B may include a substrate material layer 211 in which a concave portion R11 provided in plurality are disposed or formed, and a plurality of color conversion members 251a and 251b respectively provided in the concave portions R11. The color control portion 200B may further include a light scattering member 251c, as necessary.

Compared to the illustration in FIG. 1 in which the concave portions R10 penetrate through the substrate material layer 210 to be open at both the light exit surface of the display apparatus and a light incident surface of the color control portion 200A, in the embodiment of FIG. 2, the concave portions R11 may be disposed or formed to a length (or depth) less than the total thickness of the substrate material layer 211. Accordingly, a thickness of each of the color conversion members 251a and 251b and the light scattering member 251c in the third (thickness) direction is less than a maximum thickness of the substrate material layer 211, such that the color conversion members 251a and 251b and the light scattering member 251c are spaced apart at an interval from the emission unit 150.

A lower end portion of each of the color conversion members 251a and 251b and the light scattering member 251c, which is closest to the light-source substrate portion 100, may have a round shape and serve as a lens, for example, a microlens. Accordingly, the light emitted from the light-source substrate portion 100 and incident to the color control portion 200B may be properly focused at the color conversion members 251a and 251b and the light scattering member 251c, and color conversion and light extraction efficiencies may be improved. In an embodiment, a refractive index of each of the color conversion members 251a and 251b and the light scattering member 251c is greater than a refractive index of the substrate material layer 211. Due to the above difference in the refractive indices, the lower end portion of each of the color conversion members 251a and 251b and the light scattering member 251c may perform a lens function more properly.

Figure 3:
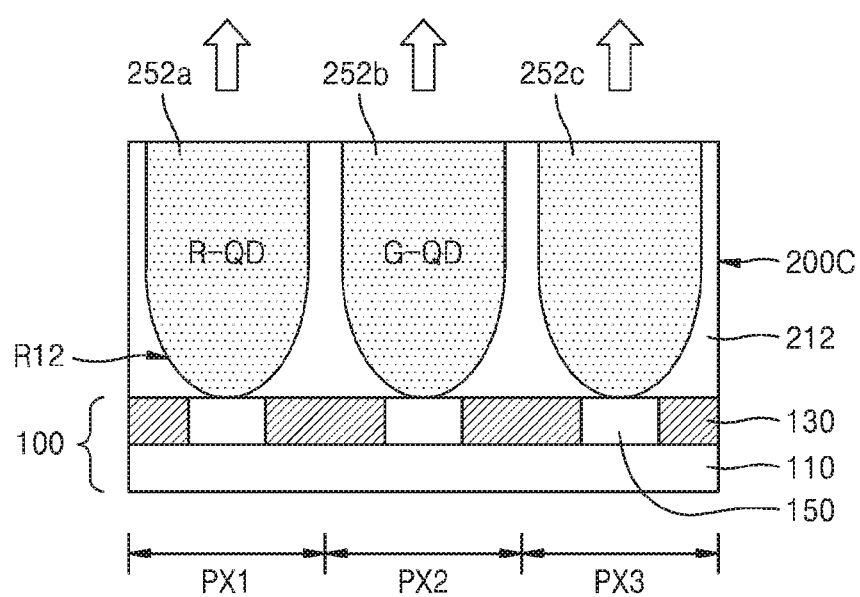
FIG. 3 is a cross-sectional view of a display apparatus according to another modified embodiment of FIG. 1.

FIG. 3 is a cross-sectional view of a display apparatus according to another modified embodiment of FIG. 1.

Referring to FIG. 3, a color control portion 200C may include a substrate material layer 212 in which a concave portion R12 provided in plurality are disposed or formed, and a plurality of color conversion members 252a and 252b respectively provided in the concave portions R12. The color control portion 200C may further include a light scattering member 252c. The concave portions R12 each may have a length (or depth) corresponding to a total thickness of the substrate material layer 212. That is, a lower end of each of the color conversion members 252a and 252b and the light scattering member 252c may contact the emission unit 150 in the zero dimension, that is, a point contact. Compared to the illustration in FIG. 1, the concave portions R12 having only a point contact with the emission unit 150 do not penetrate through the substrate material layer 212 and are therefore not open at a light incident surface of the color control portion 200A, The substrate material layer 212 of the color control portion 200C may have a first surface facing the light-source substrate portion 100 (that is, a lower surface in the view of FIG. 3), such that each of the color conversion members 252a and 252b may be considered as exposed in the zero dimension at the first surface. In the embodiment of FIG. 1, each of the first and second color conversion members 250a and 250b is exposed two dimensionally, that is, planarly, at a lower surface of the substrate material layer 210, and in the embodiment of FIG. 2, the color conversion members 251a and 251b may not be exposed or contacting at a lower surface of the substrate material layer 211. Accordingly, the embodiments of FIGS. 1 to 3 described above have structural and optical differences.

In the embodiments of FIGS. 1 to 3, the light-source substrate portion 100 is sectioned into the subpixel areas PX1, PX2 and PX3. Each of the concave portions R10, R11 or R12 may be provided in one-to-one correspondence with the subpixel areas PX1, PX2 and PX3, but the invention is not limited thereto. In this case, light loss may be reduced or effectively prevented.

Figure 4A:
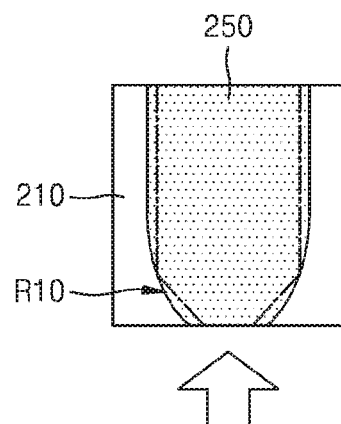
FIGS. 4A and 4B are cross-sectional views for explaining an optical waveguide and light extraction principle using a color conversion member applicable to display apparatuses, according to embodiments.
Figure 4B:
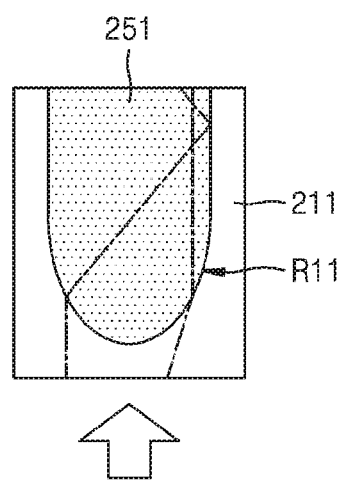

FIGS. 4A and 4B are cross-sectional views for explaining an optical waveguide and light extraction principle using a color conversion member applicable to display apparatuses according to embodiments. FIG. 4A illustrates a color conversion member 250 as described with reference to FIG. 1, and FIG. 4B illustrates a color conversion member 251 as described with reference to FIG. 2. Lines extending within the color conversion members 250 and 251 exemplarily indicate paths of light.

Referring to FIG. 4A, while being totally reflected in the color conversion member 250, light from the light-source substrate portion 100 (upward arrow in FIG. 4A) may travel upward with the color conversion member 250 and be emitted therefrom. The total reflection may be performed based on the structure and/or shape of each of the concave portions R10 and a refractive index condition between the color conversion member 250 and the substrate material layer 210.

Referring to FIG. 4B, a lower end portion of the color conversion member 251 may focus light from the light-source substrate portion 100 (upward arrow in FIG. 4B) like a lens, and light may proceed in the color conversion member 251 while being totally reflected therein. The lens and total reflection effect may be obtained from the structure and/or shape of the concave portions R11 and the refractive index condition of the color conversion member 251 and the substrate material layer 211.

As explained with reference to FIG. 4A and FIG. 4B, according to one or more embodiment, while light loss is reduced, the color conversion and light extraction efficiencies by the color conversion members 250 and 251 may be improved. In addition, directivity of light from the color conversion members 250 and 251 in a direction perpendicular to the light-source substrate portion 100 may be improved.

Figure 5:
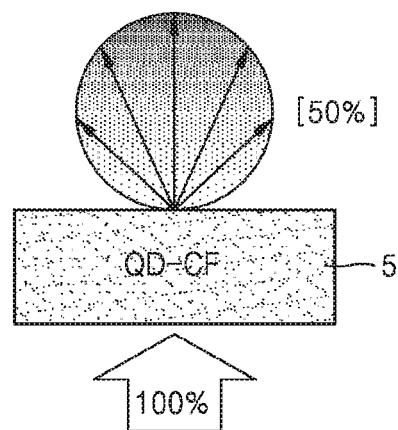
FIG. 5 is a view for explaining a problem of a quantum dot ("QD") color filter according to a comparative example.

FIG. 5 is a view for explaining a problem of a QD color filter (QD-CF) 5 according to a comparative example.

Referring to FIG. 5, the QD-CF 5 according to the comparative example may have a problem of extracting light so as to define extraction of light at a relatively low efficiency of about 50% with respect to 100% of light incident thereto. Since the emission at the QD-CF 5 is generally performed in an isotropic direction, light emitted in an upward direction as the isotropic direction may be merely about 50%. Light from a lower light source is not all utilized or absorbed by the QD-CF 5, and thus part of the light may be lost. Furthermore, since a scattering agent for light scattering is used, transmittance may be lowered even more by the scattering agent and external light reflection may be undesirably increased.

Figure 6:
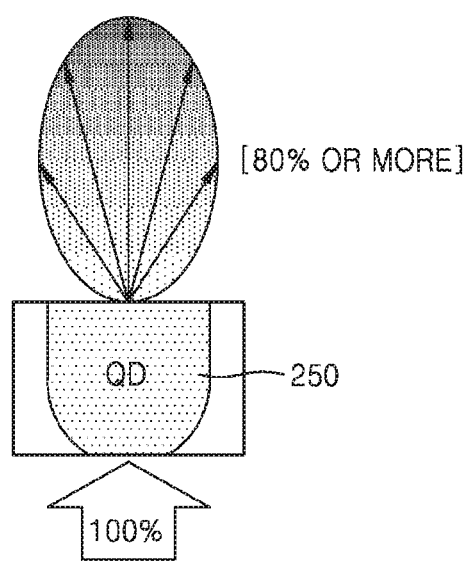
FIG. 6 illustrates a light efficiency improvement effect by a color conversion member according to an embodiment.

FIG. 6 illustrates a light efficiency improvement effect by a color conversion member 250 according to one or more embodiment.

Referring to FIG. 6, the color conversion member 250 according to one or more embodiment, which includes QDs, may extract light by converting the light at an efficiency of about 80% or more with respect to 100% of light incident thereto. The color conversion member 250 may have a structure by which light is more focused and properly guided in one or more desired directions. When an optical path in the color conversion member 250 is extended therein, the content of a light scattering agent may be reduced or the light scattering agent may be unnecessary, and thus transmittance may be improved and the external light reflection problem may be obviated. When the color conversion member 250 according to one or more embodiment is used, a light extraction efficiency of about 70% or more or about 80% or more with respect to 100% of light incident to the color conversion member 250 may be obtained.

Figure 7:
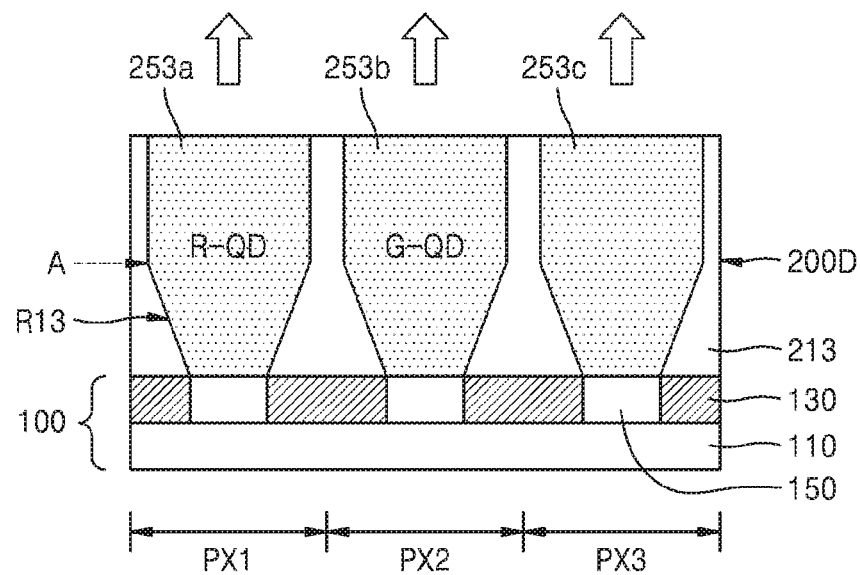
FIG. 7 is a cross-sectional view of a display apparatus according to another embodiment.

FIG. 7 is a cross-sectional view of a display apparatus according to another embodiment.

Referring to FIG. 7, a color control portion 200D may be provided on the light-source substrate portion 100. The color control portion 200D may include a substrate material layer 213 in which a concave portion R13 provided in plurality are disposed or formed, and a plurality of color conversion members 253a and 253b respectively provided in the concave portions R13. The color control portion 200D may further include a light scattering member 253c.

In this state, the concave portions R13 may have a shape different from each of the concave portions R10 of FIG. 1. Each of the concave portions R13 may have a "first portion" and a "second portion," and the first portion may be arranged closer to the light-source substrate portion 100 than the second portion. With respect to a point A, a lower portion of the concave portions R13 from the point A to a point closest to the light-source substrate portion 100 may correspond to the first portion, and an upper portion of the concave portions R13 from the point A to a point furthest from the light-source substrate portion 100 may correspond to the second portion.

The first portion may have a shape where a width of the first portion decreases in a direction toward the light-source substrate portion 100. In an embodiment, for example, the first portion the concave portions R13 may have a cross-sectional shape that is any one of a pyramid, a tapered hexagonal column and a cone, or a shape similar thereto. The pyramid and cone may be arranged upside down and may have a partially cut-away structure to omit the apex point portion of the pyramid or cone. The second portion the concave portions R13 may have a shape such as rectangular column, a hexagonal column or a circular column. However, the shape and structure the first and second portions, which are proposed herein, may be exemplary and variously changed. Even in this case, referring to the above discussions for FIG. 1, FIG. 2 and FIG. 3, a width change rate of the first portion may be greater than a width change rate of the second portion.

Figure 8:
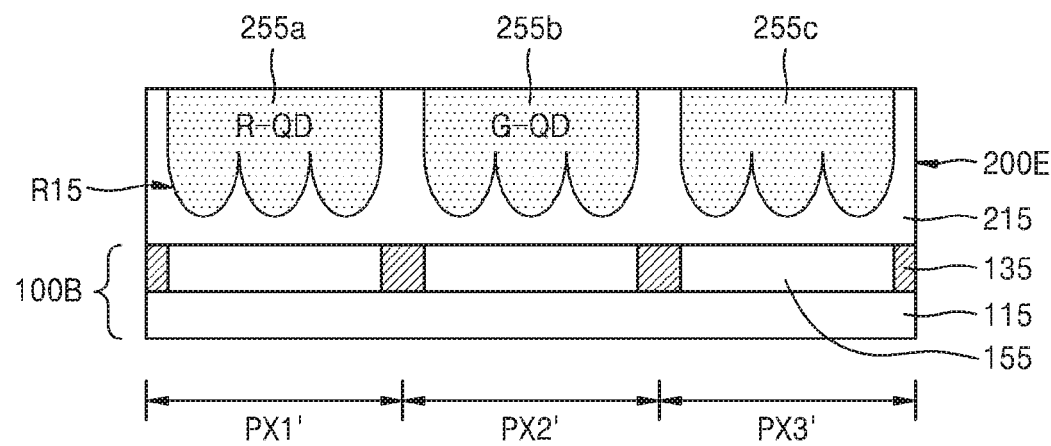
FIG. 8 is a cross-sectional view of a display apparatus according to still another embodiment.

FIG. 8 is a cross-sectional view of a display apparatus according to still another embodiment. The characteristics and features of the embodiments in FIGS. 1 to 3 may be variously applied to same or similar characteristics and features of the embodiment in FIG. 8.

Referring to FIG. 8, a color control portion 200E may be provided on a light-source substrate portion 1008. The light-source substrate portion 1008 may include a substrate layer 115 and an emission unit 155 which is provided on the substrate layer 115. The emission unit 155 may be sectioned by a pixel defining layer 135 into a plurality of areas, such as a plurality of light-emitting areas. The light-source substrate portion 1008 may include a first subpixel area PX1', a second subpixel area PX2' and a third subpixel area PX3'.

The color control portion 200E may include a substrate material layer 215, and a plurality of concave portions R15 may be disposed or formed in the substrate material layer 215. In the present embodiment, a group of the concave portions R15 may be arranged at positions corresponding to each of the subpixel areas PX1', PX2' and PX3. When the concave portion R15 corresponding to the first subpixel area PX1' is a first concave portion and the concave portion R15 corresponding to the second subpixel area PX2' is a second concave portion, a plurality of first concave portions R15 (a group thereof) may be disposed or formed to correspond to the first subpixel area PX1' and a plurality of second concave portions R15 (a group thereof) may be disposed or formed to correspond to the second subpixel area PX2'. Similarly, when the concave portion R15 corresponding to the third subpixel area PX3' is a third concave portion, a plurality of third concave portions R15 (a group thereof) may be disposed or formed to correspond to the third subpixel area PX3'. In this state, the first concave portions R15 may be arranged such that two adjacent first concave portions R15 contact each other at a vertically-extended boundary between the two adjacent first concave portions R15. That is, the adjacent first concave portions R15 may form an interface therebetween. Such a structure may be identically applied to the second concave portions and the third concave portions of the first subpixel area PX2' and the third subpixel area PX3'.

Furthermore, within the color control portion 200E, in a direction along the light source-substrate portion 100, the group of the first concave portions and the group of the second concave portions may be spaced apart from each other, and the group of the second concave portions and the group of the third concave portions may be spaced apart from each other. In other words, the group of the concave portions R15 disposed or formed in the first subpixel area PX1' may contact each other, the group of the concave portions R15 disposed or formed in the second subpixel area PX2' may contact each other, and the group of the concave portions R15 disposed or formed in the third subpixel area PX3' may contact each other. However, the group of the concave portions R15 disposed or formed in the first subpixel area PX1' and the group of the concave portions R15 disposed or formed in the second subpixel area PX2' may be spaced apart from each other, and the group of the concave portions R15 disposed or formed in the second subpixel area PX2' and the group of the concave portions R15 disposed or formed in the third subpixel area PX3' may be spaced apart from each other.

A first color conversion member 255a may be provided in the group of the concave portions R15 of the first subpixel area PX1'. A second color conversion member 255b may be provided in the group of the concave portions R15 of the second subpixel area PX2'. A light scattering member 255c or a light transmission member may be provided in the group of the concave portions R15 of the third subpixel area PX3'.

A single one of the first color conversion member 255a, the second color conversion member 255b and the light scattering member 255c or a light transmission member is common to each concave portion R15 within the respective group thereof. The first color conversion member 255a may include the first QD, and the second color conversion member 255b may include the second QD.

A width of the subpixel areas PX1', PX2' and PX3' and each of the first color conversion member 255a, the second color conversion member 255b and the light scattering member 255c is considered in the horizontal direction of the view in FIG. 8. The widths of the overall first color conversion member 255a, the second color conversion member 255b and the light scattering member 255c are substantially the same as those of the subpixel areas PX1', PX2' and PX3', respectively. As such, the first color conversion member 255a, the second color conversion member 255b and the light scattering member 255c overlaps substantially an entirety of the subpixel areas PX1', PX2' and PX3', respectively. Since the first color conversion member 255a entirely covers the first subpixel area PX1' and has a structure of a plurality of lenses (microlens) at a lower portion thereof, light loss may be reduced or effectively prevented and conversion and extraction efficiencies may be improved. This is identically applied to the second color conversion member 255b.

A width of each individual one of the concave portions R15 within a group thereof may have a width less than the width of each of the concave portions R10, R11 and R12 described with reference to FIGS. 1 to 3. In FIG. 8, each of the individual concave portions R15 may have a width of about 10 nm to about several tens of micrometers (μm). Each of the individual concave portions R10, R11 and R12 in FIGS. 1 to 3 may have a width of about several tens of nanometers to about several hundreds of micrometers. Accordingly, each of the individual concave portions R10, R11, R12 and R15 used in the embodiments may have a width of about 10 nm to about several hundreds of micrometers. In an embodiment, for example, each of the individual concave portions R10, R11, R12 and R15 may have a width of about 10 nm to about 200 micrometers or about 20 nm to about 100 micrometers.

According to a modified embodiment of FIG. 8, color conversion members 255a and 255b and the light scattering member 255c may protrude above the substrate material layer 215. An example thereof is illustrated in FIG. 9.

Figure 9:
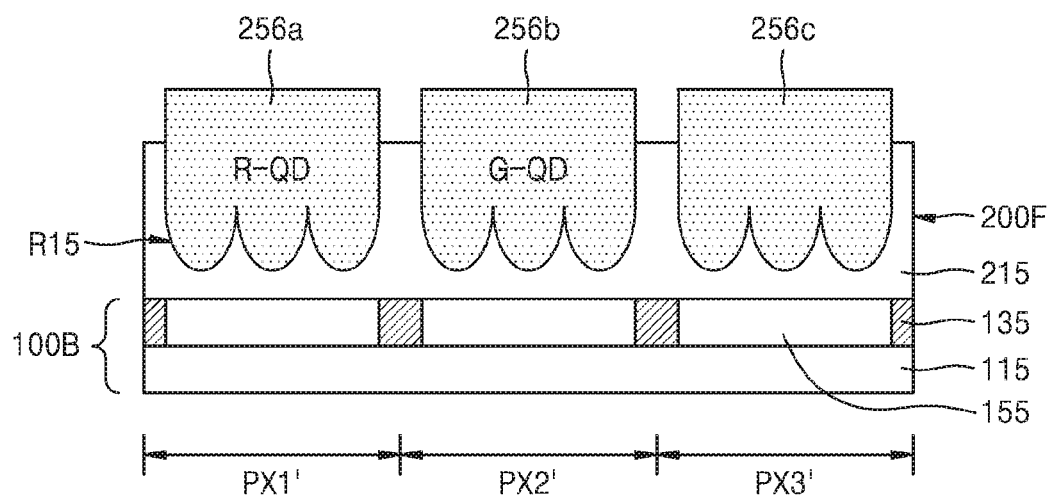
FIG. 9 is a cross-sectional view of a display apparatus according to a modified embodiment of FIG. 8.

Referring to FIG. 9, color conversion members 256a and 256b and a light scattering member 256c of a color control portion 200F may extend from within the substrate material layer 215 to protrude above the substrate material layer 215. Thicknesses and heights of the color conversion members 256a and 256b and the light scattering member 256c within a same color control portion 200F may be appropriately adjusted. That is, a thickness of the protruding portion of these elements, referenced from an upper surface of the substrate material layer 215 may be appropriately adjusted. The uppermost surface of the protruding the color conversion members 256a and 256b and the light scattering member 256c may form the light exit surface of the display apparatus together with the upper surface of the substrate material layer 215 without being limited thereto. Vertical sides of the protruding the color conversion members 256a and 256b and the light scattering member 256c, which are connected to each other by the respective uppermost surfaces thereof, may further form the light exit surface of the display apparatus together with the upper surface of the substrate material layer 215 without being limited thereto. If necessary, the thicknesses of at least two of the color conversion members 256a and 256b and the light scattering member 256c may be disposed or formed to be different from each other, such that a height of the protruding portion of these elements may be different from each other relative to the upper surface of the substrate material layer 215.

Figure 10:
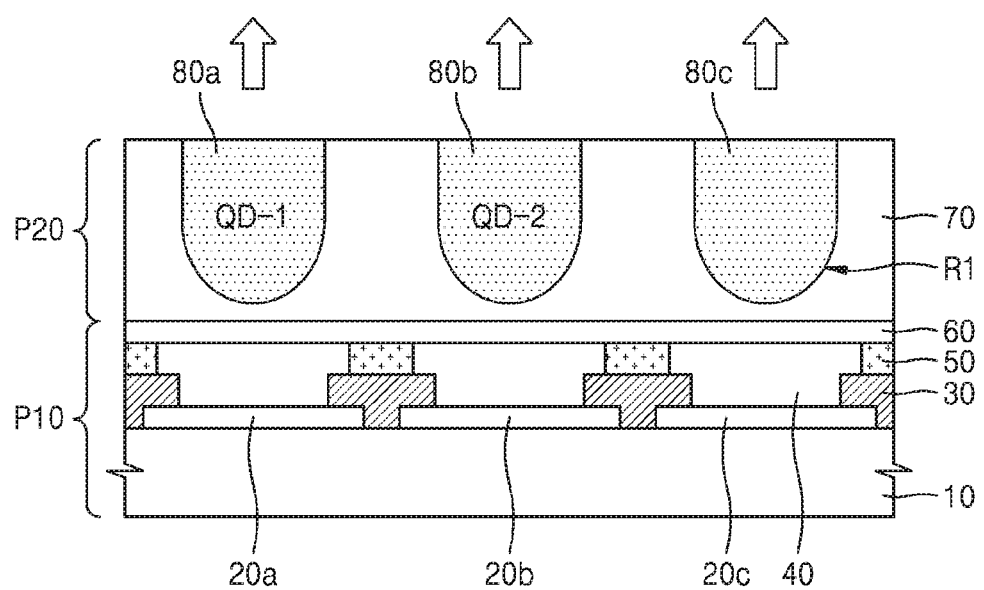
FIG. 10 is a cross-sectional view of a detailed configuration of a display apparatus according to an embodiment.

FIG. 10 is a cross-sectional view of a detailed configuration of a display apparatus according to an embodiment. The characteristics and features of the previous embodiments may be variously applied to same or similar characteristics and features of the embodiment in FIG. 10.

Referring to FIG. 10, a first electrode layer including a plurality of first electrodes 20a, 20b and 20c may be provided on a first substrate 10. The first substrate 10 may include a plurality of thin film transistors ("TFTs"; not shown), and the TFTs within the first substrate 10 may be respectively electrically connected to one or more of a first electrode among the first electrodes 20a, 20b and 20c. The first electrodes 20a, 20b and 20c may be conductive elements patterned to correspond to respective subpixel areas. The first electrodes 20a, 20b and 20c may include or be formed of a transparent electrode material such as Indium tin oxide ("ITO"), or metal or a metal compound. The TFTs may be control or switching elements with which the subpixel areas are controlled or driven to display an image and/or generate light for displaying the image.

A pixel defining layer 30 for delimiting subpixel areas may be provided on the first substrate 10 and on the first electrodes 20a, 20b, and 20c. The pixel defining layer 30 may have or define an opening exposing one or more of the first electrodes 20a, 20b and 20c. The pixel defining layer 30 may include or be formed of an insulating material.

An emission unit 40 may be provided in plurality on the subpixel areas that are delimited by the pixel defining layer 30. The emission unit 40 may be, for example, an OLED device. In this case, the emission unit 40 may include an emission layer including an organic-based light emitting material. The emission unit 40 may include a hole transport layer provided between the emission layer, and the first electrodes 20a, 20b and 20c, respectively, and an electron transport layer provided on the emission layer. Furthermore, the emission unit 40 may further include at least one of a hole injection layer and an electron injection layer.

A second electrode 60 may be provided on the emission unit 40. If necessary, an interlayer insulating layer 50 may be further provided on the pixel defining layer 30 to surround the emission unit 40 in a top plan view (e.g., a view along the thickness direction of the plane defined by the first and second directions). The first electrodes 20a, 20b and 20c may serve as an anode and the second electrode 60 may serve as a cathode, and vice versa. The anode and cathode may be portions of an OLED device.

The elements from the first substrate 10 to the second electrode 60 may be referred to as a light-source substrate portion P10. The light-source substrate portion P10 may be an OLED substrate. A device portion from the first electrodes 20a, 20b and 20c to the second electrode 60 may be referred to as a light-source device portion (OLED device portion). The light-source substrate portion P10 may be a top-surface emission device which emits light from an upper surface thereof. The upper surface of the light-source substrate portion P10 may be defined by the second electrode 60, without being limited thereto.

A color control portion P20 may be provided on an upper surface of the light-source substrate portion P10. The color control portion P20 may include a second substrate 70 including a concave portion R1 provided in plurality within the second substrate 70, and first and second color conversion members 80a and 80b and a light scattering member 80c respectively provided in the concave portions R1. The first color conversion member 80a may include a first quantum dot QD-1, and the second color conversion member 80b may include a second quantum dot QD-2. The concave portions R1 and the color conversion members 80a and 80b may be the same as or similar to the concave portions and the color conversion members described with reference to FIGS. 1 to 3 and 7 to 9, and may be variously changed.

When the light-source substrate portion P10 is an OLED substrate, the OLED substrate may be any one of a blue-OLED substrate, a white-OLED substrate and a cyan-OLED substrate. In an embodiment, for example, the OLED substrate may be a device including one blue emission layer, a device including each of a blue emission layer and a sky-blue emission layer, a device including each of a blue emission layer and a green emission layer, a device including each of a blue emission layer, a green emission layer and a yellow emission layer, or a device including each of a blue emission layer, a green emission layer and a red emission layer. However, an emission color and a detailed structure of the OLED substrate are not limited thereto and may be changed.

Figure 11:
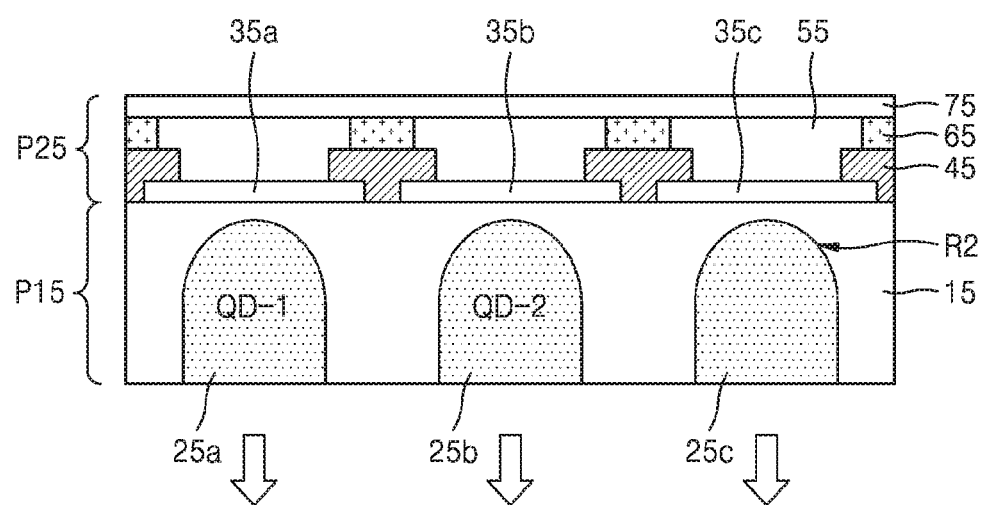
FIG. 11 is a cross-sectional view of a detailed configuration of a display apparatus according to another embodiment.

FIG. 11 is a cross-sectional view of a detailed configuration of a display apparatus according to another embodiment. The characteristics and features of the previous embodiments may be variously applied to same or similar characteristics and features of the embodiment in FIG. 11.

Referring to FIG. 11, a color control portion P15 may include a substrate 15 in which a concave portion R2 provided in plurality are disposed or formed, and color conversion members 25a and 25b and a light scattering member 25c respectively provided in the concave portions R2.

By using the color control portion P15 as a (base) substrate, a light-source device portion (light-source substrate portion) P25 may be disposed or formed thereon. The substrate 15 is common to each of the color control portion P15 and the light-source device portion P25. The light-source device portion P25 may include a plurality of first electrodes 35a, 35b and 35c, a pixel defining layer 45, an emission unit 55, an interlayer insulating layer 65, and a second electrode 75, which are provided on the substrate 15. The structure of these elements may be similar to the structure described with reference to FIG. 10. In the present embodiment, the light-source device portion P25 may be a rear-surface emission device which emits light from a lower surface thereof. The lower surface of the light-source substrate portion P25 may be defined by the first electrodes 35a, 35b, and 35c and the pixel defining layer 45, without being limited thereto. The structures and materials of the first electrodes 35a, 35b and 35c, the emission unit 55, and the second electrode 75 may be selected for the rear-surface emission. In an embodiment, for example, the second electrode 75 may serve as a reflection plate, and the first electrodes 35a, 35b and 35c may be transparent. The color control portion P15 may be arranged on a rear surface (lower surface) of the light-source device portion P25.

In the present embodiment, since the color control portion P15 is formed with the substrate 15 and the light-source device portion P25 is formed on the same substrate 15 which forms a portion of the color control portion P15, the display apparatus may be formed by using only one substrate that is the substrate 15. Accordingly, a display apparatus using only one substrate common to each of the color control portion P15 and the light-source device portion P25 may be advantageous in terms of manufacturing process or costs of the display apparatus.

Figure 12A:
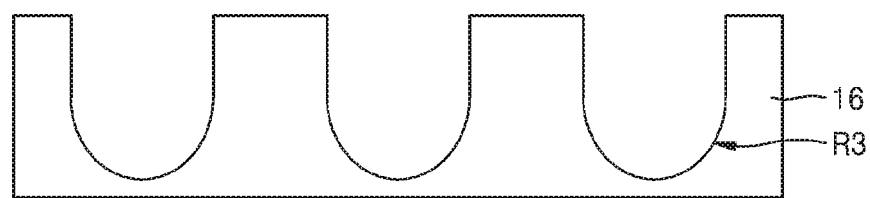
FIGS. 12A to 12C are cross-sectional views of a method of manufacturing a display apparatus, according to an embodiment.
Figure 12B:
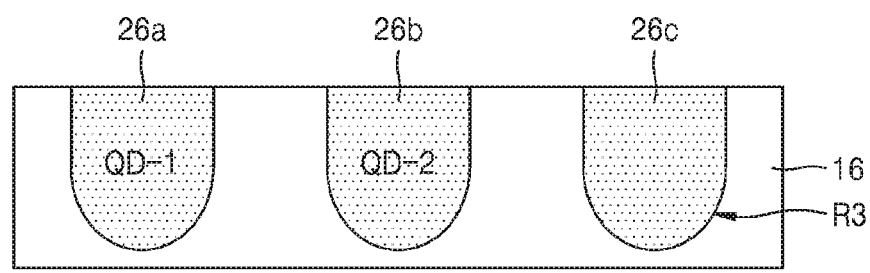
Figure 12C:
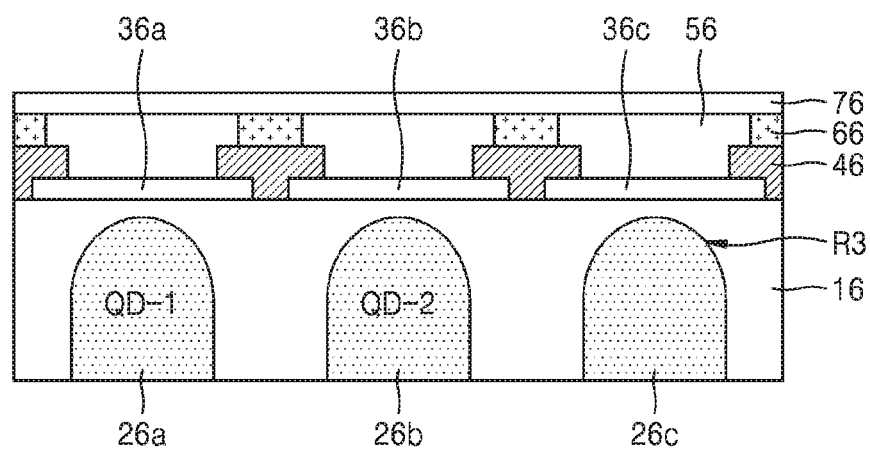

FIGS. 12A to 12C are cross-sectional views of a method of manufacturing a display apparatus, according to an embodiment. The present embodiment may be an example of a method of manufacturing the display apparatus of FIG. 11, without being limited thereto. The characteristics and features of the previous embodiments may be variously applied to same or similar characteristics and features of the embodiment in FIGS. 12A to 12C.

Referring to FIG. 12A, a concave portion R3 may be formed in a substrate 16. Portions of the substrate 16 define the concave portions R3. The concave portions R3 may be formed by using any one of a number of methods suitable for forming the concave portions R3. In an embodiment, for example, the concave portions R3 may be formed by an imprinting lithography process. When the imprinting lithography process is used, the shape of the concave portions R3 may be easily controlled. However, the formation method of the concave portions R3 is not limited to the imprinting lithography, and may be changed. The concave portions R3 may be formed by a general etching process or other methods.

Referring to FIG. 12B, a plurality of color conversion members 26a and 26b and a light scattering member 26c may be disposed or formed in the concave portions R3. The color conversion members 26a and 26b may be formed by filling the concave portions R3 with a combination of photoresist PR, QDs and a light scattering agent, and then curing the same. The light scattering member 26c may be formed by filling the concave portions R3 with a combination of the photoresist PR and the light scattering agent and then curing the same. Since the concave portions R3 serves as a kind of mold, the color conversion members 26a and 26b and the light scattering member 26c may be easily formed. As such, a shape of the color conversion members 26a and 26b and the light scattering member 26c is defined by a shape of a respective concave portion R3. A surface of the color conversion members 26a and 26b and the light scattering member 26c may be coplanar with a surface of the substrate 16, without being limited thereto. In an embodiment, one or more of the color conversion members 26a and 26b and the light scattering member 26c may extend further than the surface of the substrate 16 to protrude therefrom. The light scattering member 26c may be replaced with a light transmission member having no scattering function or no color-converting function as discussed above.

Referring to FIG. 12C, when the substrate 16 of FIG. 12B is turned upside down, the light-source device portion P25 described with respect to FIG. 11 may be disposed or formed on the substrate 16. The light-source device portion P25 shown in FIG. 12C may include first electrodes 36a, 36b and 36c, a pixel defining layer 46, an emission unit 56, an interlayer insulating layer 66 and a second electrode 76.

In one or more of the above-identified embodiments, while a case of forming one overall pixel area by using three subpixel areas is mainly described, the configuration and arrangement method of the subpixel areas may be vary. In this regard, the color control portion may include the first color conversion member including the first QD, the second color conversion member including the second QD and the third color conversion member including the third QD. Furthermore, the color control portion may further include a blank area at which incident light is not color-converted. In addition, the color control portion may have various color arrangement methods such as RGB, RGBW, etc.

The display apparatuses according to one or more of the above-described embodiments may be applied to a variety of electronic apparatuses. In embodiments, for example, the display apparatuses may be usefully applied to relatively compact electronic apparatuses such as portable electronic devices or wearable electronic devices, and to relatively medium or large sized electronic apparatuses such as home appliances. In embodiments, for example, the display apparatuses may be used for a variety of displays such as televisions ("TVs"), electronic device monitors or display screens, mobile devices, etc.

Although there are many detailed descriptions in the above description, they should be interpreted to be examples of detailed embodiments, rather than to be limitations of the scope of right. For example, one having ordinary skill in the art would understand that the structures and features of the display apparatuses described with reference to FIGS. 1 to 3 and FIGS. 7 to 11, may be modified in various ways. Thus, it should be understood that embodiments described herein should be considered in a descriptive sense only and not for purposes of limitation. While one or more embodiments have been described with reference to the figures, it will be understood by those of ordinary skill in the art that various changes in form and details may be made therein without departing from the spirit and scope as defined by the following claims.

What is claimed is:

1. A display apparatus comprising:
a light-source substrate portion which generates light; and
a color control portion to which the generated light from the light-source substrate portion is incident and at which color of the generated light is adjusted to define a color-converted light having a color different from that of the generated light,
wherein the color control portion comprises:
an exit surface through which the color-converted light exits the color control portion;
a substrate comprising a plurality of concave portions defined therein, wherein:
each of the concave portions extended along a direction from the light-source substrate portion to the exit surface of the color control portion,
each of the plurality of concave portions comprises a first portion and a second portion sequentially arranged in the direction from the light-source substrate portion to the exit surface of the color control portion, the first portion being closer to the light-source substrate portion than the second portion,
a width of the first portion and the second portion are taken in a direction along the light-source substrate portion, and
as a distance to the light-source substrate portion decreases along the direction from the light-source substrate portion to the exit surface of the color control portion,
the width of the first portion decreases to define a width change rate of the first portion, and
the width change rate of the first portion is greater than a width change rate of the second portion; and
a plurality of color conversion members respectively in the plurality of concave portions, the color conversion members each comprising a color-converting material which converts the color of the generated light to the color of the color-converted light.

2. The display apparatus of claim 1, wherein along the direction from the light-source substrate portion to the exit surface of the color control portion, the width of the second portion is substantially constant.

3. The display apparatus of claim 1, wherein in cross-section the first portion has a round shape.

4. The display apparatus of claim 1, wherein the first portion has a shape of any one of a microlens, a pyramid, a tapered hexagonal column and a cone.

5. The display apparatus of claim 1, wherein
the light-source substrate portion comprises a plurality of subpixel areas at which the color-converted light is emitted to display an image, and
the plurality of concave portions of the color control portion are disposed in one-to-one correspondence with the plurality of subpixel areas of the light-source substrate portion.

6. The display apparatus of claim 1, wherein
the light-source substrate portion comprises a plurality of subpixel areas at which the color-converted light is emitted to display an image,
the plurality of concave portions comprise a plurality of first concave portions each corresponding to a same first subpixel area, and
within the same first subpixel area, two adjacent first concave portions contact each other.

7. The display apparatus of claim 6, wherein
the plurality of concave portions further comprise a plurality of second concave portions each corresponding to a same second subpixel area, the same second subpixel area being sequentially arranged with the first subpixel area within the light-source substrate portion,
the plurality of first concave portions together forms a group thereof within the same first subpixel area and the plurality of second concave portions together forms a group thereof within the same second subpixel area, and
within the substrate of the color control portion, the group of the plurality of first concave portions and the group of the plurality of second concave portions are spaced apart from each other.

8. The display apparatus of claim 1, wherein
the color control portion further comprises an incident surface through which the generated light is incident to the color control portion,
an upper surface of the substrate includes the exit surface and a lower surface of the substrate includes the incident surface,
upper ends of the plurality of concave portions coincide with the upper surface of the substrate, and
lower ends of the plurality of concave portions which are closest to the light-source substrate portion meet the light-source substrate portion at a zero dimension point or at a two-dimensional area.

9. The display apparatus of claim 1, wherein
the color control portion further comprises an incident surface through which the generated light is incident to the color control portion,
an upper surface of the substrate includes the exit surface and a lower surface of the substrate includes the incident surface,
upper ends of the plurality of concave portions coincide with the upper surface of the substrate, and
along the direction from the light-source substrate portion to the exit surface of the color control portion, lower ends of the plurality of concave portions which are closest to the light-source substrate portion are spaced apart from the light-source substrate portion.

10. The display apparatus of claim 1, wherein within the color control portion:
the substrate has a first refractive index, and
the plurality of color conversion members have a second refractive index, the second refractive index being greater than the first refractive index.

11. The display apparatus of claim 1, wherein the plurality of color conversion members comprise:
a first color-converting material including a first quantum dot which converts the color of the generated light from the light-source substrate portion to red light, and
a second color-converting material a second quantum dot which converts the color of the generated light from the light-source substrate portion to green light.

12. The display apparatus of claim 1, the color control portion further comprises a light scattering member or a light transmission member in a concave portion different from the plurality of concave portions in which the plurality of color conversion members are disposed,
wherein each of the light scattering member and the light transmission member does not color-convert the generated light from the light-source substrate portion.

13. The display apparatus of claim 1, wherein
the light-source substrate portion comprises an organic light emitting device substrate which generates the light, and
the organic light emitting device substrate comprises any one of a blue-organic light emitting device substrate which generates blue light, a white-organic light emitting device substrate which generates white light, and a cyan-organic light emitting device substrate which generates cyan light.

14. The display apparatus of claim 1, wherein the light-source substrate portion comprises an organic light emitting device, an inorganic light-emitting device or a backlight unit which generates the light.

15. The display apparatus of claim 1, wherein
the generated light from the light-source substrate portion has a center wavelength of about 550 nanometers or less, and
the color-converted light from the plurality of color conversion members has a center wavelength of about 450 nanometers or more and about 1200 nanometers or less.

16. The display apparatus of claim 1, wherein
the light-source substrate portion comprises a first substrate on which is disposed a light-source device portion with which the light-source substrate portion is driven to generate the light,
the substrate of the color control portion is a second substrate different from the first substrate of the light-source substrate, and
the light-source device portion of the light-source substrate is disposed between the first substrate thereof and the second substrate of the color control portion.

17. The display apparatus of claim 1, wherein
the light-source substrate portion comprises a first substrate on which is disposed a light-source device portion with which the light-source substrate portion is driven to generate the light, and
the first substrate of the light-source substrate portion is the substrate of the color control portion.

18. The display apparatus of claim 1, wherein the color-converting material includes a quantum dot.

19. A display apparatus comprising:
an organic light emitting device panel which generates light; and
a color control portion to which the generated light from the organic light emitting device panel is incident and at which color of the generated light is adjusted to define a color-converted light having a color different from that of the generated light,
wherein the color control portion comprises:
an exit surface through which the color-converted light exits the color control portion;
a substrate comprising a plurality of concave portions defined therein, wherein:
each of the concave portions is extended along a direction from the organic light emitting device panel to the exit surface of the color control portion,
each of the plurality of concave portions comprises a first portion and a second portion sequentially arranged in the direction from the organic light emitting device panel to the exit surface of the color control portion, the first portion being closer to the organic light emitting device panel than the second portion,
a width of the first portion and the second portion are taken in a direction along the organic light emitting device panel, and
as a distance to the organic light emitting device panel decreases along the direction from the organic light emitting device panel to the exit surface of the color control portion,
the width of the first portion decreases to define a width change rate of the first portion, and
the width change rate of the first portion is greater than a width change rate of the second portion, and
a plurality of color conversion members respectively in the plurality of concave portions, the color conversion members each comprising a color-converting material which converts the color of the generated light to the color of the color-converted light,
the organic light emitting device panel comprises a plurality of subpixel areas at which the color-converted light is emitted to display an image, and
the plurality of concave portions of the color control portion are disposed in one-to-one correspondence with the plurality of subpixel areas of the organic light emitting device panel.

20. The display apparatus of claim 19, wherein the color-converting material includes a quantum dot.

21. A display apparatus comprising:
a light-source substrate portion which generates light; and
a color control portion to which the generated light from the light-source substrate portion is incident and at which color of the generated light is adjusted to define a color-converted light having a color different from that of the generated light,
wherein the color control portion comprises:
an exit surface through which the color-converted light exits the color control portion;
a substrate comprising a plurality of concave portions defined therein, each of the concave portions extended along a direction from the light-source substrate portion to the exit surface of the color control portion; and
a plurality of color conversion members respectively in the plurality of concave portions, the color conversion members each comprising a color-converting material which converts the color of the generated light to the color of the color-converted light, wherein the light-source substrate portion comprises a plurality of subpixel areas at which the color-converted light is emitted to display an image, the plurality of concave portions comprise a plurality of first concave portions each corresponding to a same first subpixel area, and within the same first subpixel area, two adjacent first concave portions contact each other.

22. The display apparatus of claim 21, wherein the plurality of concave portions further comprise a plurality of second concave portions each corresponding to a same second subpixel area, the same second subpixel area being sequentially arranged with the first subpixel area within the light-source substrate portion, the plurality of first concave portions together forms a group thereof within the same first subpixel area and the plurality of second concave portions together forms a group thereof within the same second subpixel area, and within the substrate of the color control portion, the group of the plurality of first concave portions and the group of the plurality of second concave portions are spaced apart from each other.

* * * * *